United States Patent [19]
Song et al.

[11] Patent Number: 5,475,389
[45] Date of Patent: Dec. 12, 1995

[54] ADAPTIVE VARIABLE-LENGTH CODING APPARATUS

[75] Inventors: Jun K. Song; Chul D. Oh, both of Ichon-kun, Rep. of Korea

[73] Assignee: Hyundai Electronics Industries Co., Ltd., Kyoungki-Do, Rep. of Korea

[21] Appl. No.: 199,892

[22] Filed: Feb. 22, 1994

[30] Foreign Application Priority Data

Feb. 22, 1993 [KR] Rep. of Korea ............ 93-2413

[51] Int. Cl.⁶ ............................................. H03M 7/40
[52] U.S. Cl. ............................................. 341/67
[58] Field of Search ............................ 341/60, 67, 51

[56] References Cited

U.S. PATENT DOCUMENTS 5,321,398  6/1994  Ikeda ............................ 341/67

Primary Examiner—Brian K. Young
Attorney, Agent, or Firm—Popham, Haik, Schnobrich & Kaufman, Ltd.

[57] ABSTRACT

The adaptive variable-length coding apparatus, capable of being used as both of an encoder and a decoder, includes a first content addressable memory adapted to store source symbols each having a fixed length and generating an address signal corresponding to a source symbol to be variable-length coded, a second content addressable memory adapted to store a number of variable-length code words and generating an address signal corresponding to a variable-length code word to be decoded into a corresponding source symbol, a normal memory adapted to store a number of length data about lengths of variable-length code words stored in the second content addressable memory, a first switching stage connected between the first and second content addressable memories and adapted to switch sending of the address signal generated in the first content addressable memory to the second content addressable memory and sending of the address signal generated in the second content addressable memory to the first content addressable memory, and a second switching stage adapted to selectively send the address signal generated in the first content addressable memory and the address signal generated in the second content addressable memory to the normal memory.

4 Claims, 4 Drawing Sheets

ADAPTIVE VARIABLE-LENGTH CODING APPARATUS

BACKGROUND OF THE INVENTION

1. Field of the Invention

The present invention relates to an adaptive variable-length coding apparatus for not only converting fixed length code words into variable-length code words, but also converting variable-length code words into fixed length code words.

2. Description of the Prior Art

Generally, variable-length coding is to compress image data so that the image data having a large bandwidth can be transmitted in a real time through a transmission medium having a small bandwidth. In accordance with such a variable-length coding, a code word having the minimum number of bits is allocated to source symbols frequently used, thereby enabling the bit rate of the source symbols to be reduced. Well-known variable-length coders are classified into variable-length encoders, in which source symbols are processed to correspond to variable-length code words, and variable-length decoders, in which source symbols corresponding to the variable-length code words are searched from a decoding tree. The variable-length encoders have a construction contrary to that of the variable-length decoders. Due to such a difference in construction, conventional variable-length coders could not be used both as an encoder and a decoder.

In cases of change and addition of source symbols or variable-length code words, the variable-length encoder and the variable-length decoder should be re-designed because they include look-up tables or programmable logic arrays. In a variable-length coder having a look-up table, the memory capacity is unnecessarily large because code words corresponding to the number of bits of source symbols must be stored in the memory.

SUMMARY OF THE INVENTION

Therefore, an object of the present invention is to provide an adaptive variable-length coding apparatus capable of being used as both an encoder and a decoder.

In accordance with the present invention, this object can be accomplished by providing an adaptive variable-length coding apparatus comprising: first content addressable memory means adapted to store source symbols each having a fixed length and generating an address signal corresponding to a source symbol to be variable-length coded; second content addressable memory means adapted to store a number of variable-length code words and generating an address signal corresponding to a variable-length code word to be decoded into a corresponding source symbol; normal memory means adapted to store a number of length data about lengths of variable-length code words stored in said second content addressable memory means; first switching means connected between said first and second content addressable memory means and adapted to switch sending of said address signal generated in the first content addressable memory means to the second content addressable memory means and sending of said address signal generated in the second content addressable memory means to the first content addressable memory means; and second switching means adapted to selectively send the address signal generated in the first content addressable memory means and the address signal generated in the second content addressable memory means to said normal memory means.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
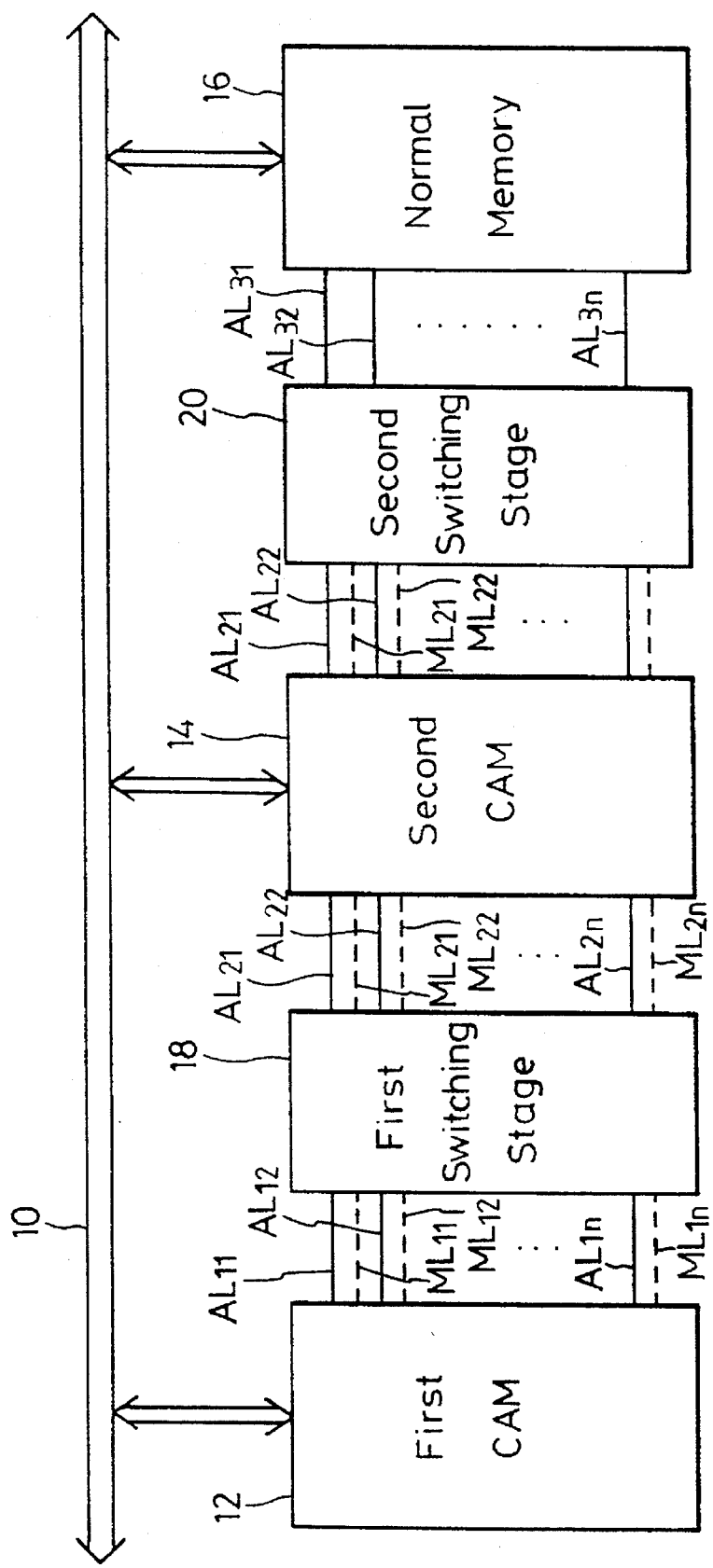
FIG. 1 is a block diagram of an adaptive variable-length coding apparatus in accordance with the present invention.

Referring to FIG. 1, there is illustrated an adaptive variable-length coding apparatus in accordance with the present invention. As shown in FIG. 1, the apparatus comprises a first content addressable memory (CAM) 12, a second CAM 14, and a normal memory 16, all of which are connected to a bus line 10.

The first CAM 12 includes a plurality of maskable memory cell arrays (not shown) for storing a number of source symbol data, and a plurality of address enable lines $AL_{11}$ to $AL_{1n}$ for respectively controlling access operations of the maskable memory cell arrays. Based on logic signals from the address enable lines $AL_{11}$ to $AL_{1n}$, the corresponding maskable memory cell arrays store the source symbol data received from the bus line 10 therein, read the stored source symbol data and send the read source symbol data to the bus line 10. The maskable memory cell arrays carry out write operations upon updating reference source symbol data and reading operations upon decoding variable-length data. Where the source symbol data stored in the maskable memory cell array are to be updated, the logic signals applied to the address enable line $AL_{11}$ to $AL_{1n}$ may be generated in a central processing unit (not shown). In a mode for decoding the variable-length code words, the address enable lines $AL_{11}$ to $AL_{1n}$ receive logic signals from the second CAM 14. Where the source symbol data is encoded into a variable-length code word, each of the maskable memory cell arrays compares the source symbol data received from the bus line 10 with its stored reference source symbol data. Where the source symbol data is identical to the reference source symbol data, each maskable memory cell array generates a match signal having a predetermined logic. Match signals generated from the memory cell arrays are sent to a plurality of match line $ML_{11}$ to $ML_{1n}$, respectively.

Similarly, the second CAM 14 includes a plurality of maskable memory cell arrays (not shown) for storing a number of variable-length code words, and a plurality of address enable lines $AL_{21}$ to $AL_{2n}$ for respectively controlling access operations of the maskable memory cell arrays. Based on logic signals from the address enable lines $AL_{21}$ to $AL_{2n}$, the corresponding maskable memory cell arrays of the second CAM 14 store the variable-length code words received from the bus line 10 therein, read the stored variable-length code words and send the read variable-length code words to the bus line 10. The maskable memory cell arrays carry out writing operations upon updating variable-length code words and reading operations upon encoding variable-length code words. Where the source symbol data stored in the maskable memory cell array are to be updated, the address enable line $AL_{21}$ to $AL_{2n}$ receive logic signal from the central processing unit. In a mode for encoding the variable-length code words, the address enable lines $AL_{21}$ to $AL_{2n}$ receive match signals from the first CAM 12. In a mode for decoding a variable-length code word, each of the maskable memory cell arrays compares the variable-length code word received from the bus line 10 with its previously stored variable-length code word. Where the variable-length code word received from the bus line 10 is identical to the previously stored variable-length code word, each maskable memory cell array generates a match signal having a predetermined logic. Match signals generated from the memory cell arrays are sent to a plurality of match line $ML_{21}$ to $ML_{2n}$, respectively. Each of the maskable memory cell arrays has memory cells which correspond in number to bits of the longest variable-length code word. Each maskable memory cell arrays is divided into an effective memory cell region, in which the variable-length code word is stored, and a redundancy memory cell region, in which redundancy data is stored.

on the other hand, the normal memory 16 includes a normal memory cell array for storing a number of length data each indicative of the number of bits of a variable-length code word, and a plurality of address enable lines $AL_{31}$ to $AL_{3n}$ for respectively controlling access operations of the normal memory cell arrays. Based on logic signals from the address enable lines $AL_{31}$ to $AL_{3n}$, the corresponding normal memory cell arrays carry out writing and reading operations. In other words, where the length data is updated, each of the normal memory cell arrays stores length data received from the bus line 10 therein. In decoding and encoding modes for variable-length code words, each normal memory cell array reads the stored length data and sends the read length data to the bus line 10.

The apparatus further comprises a first switching stage 18 connected between the first CAM 12 and the second CAM 14, and a second switching stage 20 connected between the second CAM 14 and the normal memory 16. For updating the source symbol data, the variable-length code words and the length data, the first switching stage 18 connects the address enable lines $AL_{11}$ to $AL_{1n}$ of the first CAM 12 to the address enable lines $AL_{21}$ to $AL_{2n}$ of the second CAM 14, respectively. In the mode for encoding the variable-length code words, the second switching stage 18 connects the match lines $ML_{11}$ to $ML_{1n}$ of the first CAM 12 to the address enable lines $AL_{21}$ to $AL_{2n}$ of the second CAM 14. In the mode for decoding the variable-length code words, the first switching stage 18 connects the match lines $ML_{21}$ to $ML_{2n}$ of the second CAM 14 to the address enable lines $AL_{11}$ to $AL_{1n}$ of the first CAM 12.

The second switching stage 20 serves to selectively connect the address enable lines $AL_{21}$ to $AL_{2n}$ and the match lines $ML_{21}$ to $ML_{2n}$ of the second CAM 14 to the address enable lines $AL_{31}$ to $AL_{3n}$ of the normal memory 20. In other words, where the source symbol data, the variable-length code words and the length data are to be converted, the second switching stage 20 sends, to the address enable lines $AL_{31}$ to $AL_{3n}$ of the normal memory 20, the logical signals applied on the address enable lines $AL_{21}$ to $AL_{2n}$ of the second CAM 14 via the address enable lines $AL_{11}$ to $AL_{1n}$. In the mode for encoding the variable length code words, the second switching stage 20 sends, to the address enable lines $AL_{31}$ to $AL_{3n}$ of the normal memory 16, the match signals applied from the match lines $ML_{11}$ to $ML_{1n}$ of the first CAM 12 on the address enable lines $AL_{21}$ to $AL_{2n}$ of the second CAM 14. In the mode for decoding the variable-length code words, the second switching stage 20 sends the match signals generated from the match lines $ML_{21}$ to $ML_{2n}$ of the second CAM 14 to the address enable lines $AL_{31}$ to $AL_{3n}$ of the normal memory 16.

Figure 2:
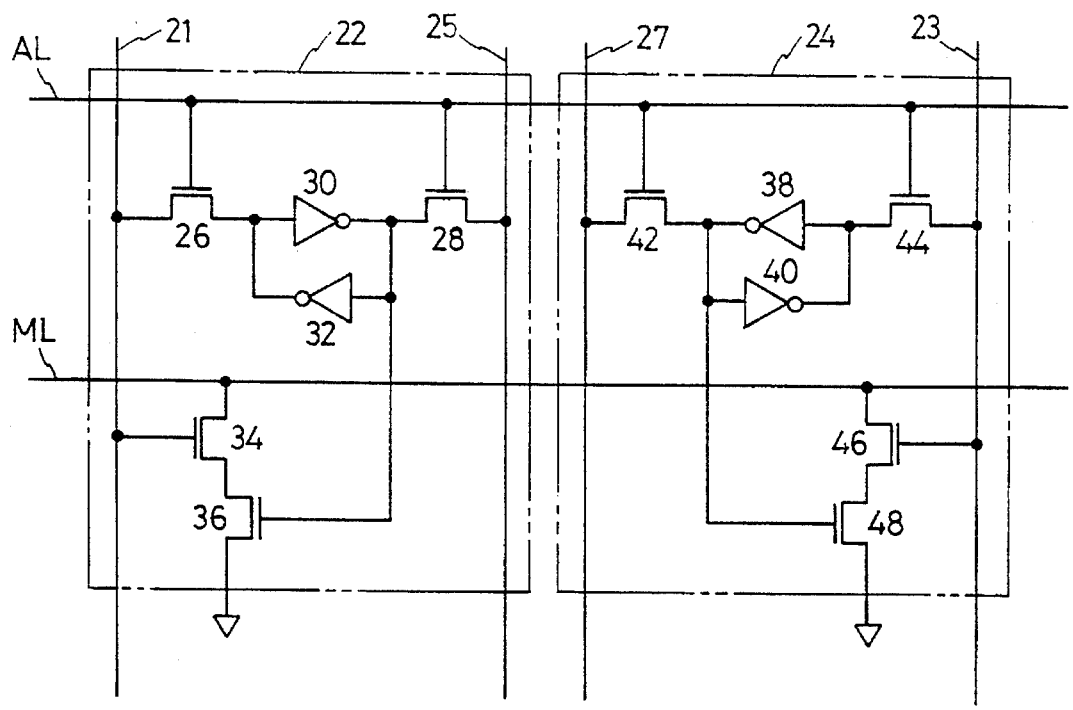
FIG. 2 is a circuit diagram of a maskable memory cell constituting each of first and second content addressable memories shown in FIG. 1.

FIG. 2 shows a maskable memory cell which may be a unit constituting element of each of the first CAM 12 and the second CAM 14. As shown in FIG. 2, the maskable memory cell includes a maskable true circuit 22 and a maskable complementary circuit 24 both connected in common to an address enable line AL and a match line ML.

Based on a logic signal from the address enable line AL, the maskable true circuit 22 stores bit data received from the true bit data input line 21 therein or inverts the stored bit data and outputs the inverted bit data via a complementary bit data output line 25. Also, the maskable true circuit 22 compares the true bit data applied to the true bit data input line 21 with the stored true bit data and thereby generates a bit match signal. Where the true bit data applied to the true bit data input line 21 is identical to the stored true bit data, the bit match signal has a predetermined logic.

The maskable true circuit 22 includes a MOS transistor 26 connected at its drain to the true bit data input line 21, a MOS transistor 28 connected at its source to the complementary bit data output line 25, and a pair of inverters 30 and 32 oppositely connected in parallel between the source of the MOS transistor 26 and the drain of the MOS transistor 28. Based on a logic signal applied to the gate thereof from the address enable line AL, the MOS transistor 26 sends the true bit data from the true bit data input line 21 to the inverters 30 and 32. Similarly, the MOS transistor 28 sends the true bit data inverted by the inverter 30 to the complementary bit data output line 25, based on a logic signal applied to the gate thereof from the address enable line AL. The inverters 30 and 32 serve to store the true bit data from the MOS transistor 26. As a result, the MOS transistors 26 and 28 and the inverters 30 and 32 together constitute a true data storing circuit.

The maskable true circuit 22 further includes a MOS transistor 34 connected at its drain to the bit match line BML, and a MOS transistor 36 connected at its drain and source to the source of the MOS transistor 34 and the ground voltage GND, respectively. When the inverted true bit data from the inverter 30 has a predetermined logic, the MOS transistor 36 is turned on so that the ground voltage GND can be applied to the source of the MOS transistor 34. On the other hand, the MOS transistor 34 is turned on when the true bit data applied to the gate thereof from the true bit data input line 21 has a logic contrary to the output logic of the inverter 30, thereby causing the MOS transistor to be connected at its source to the bit match line BML. As a result, the MOS transistors 34 and 36 serve to compare the true bit data applied to the true bit data input line 21 with the stored true bit data.

Based on a predetermined logic signal from the address enable line AL, the maskable complementary circuit 24 stores complementary bit data received from the complementary bit data input line 23 therein or inverts the stored complementary bit data and outputs the inverted complementary bit data via a true bit data output line 27. Also, the maskable complementary circuit 24 compares the complementary bit data applied to the complementary bit data input line 23 with the stored complementary bit data and thereby generates a bit match signal to be applied to the bit match line BML. Where the complementary bit data applied to the complementary bit data input line 23 is identical to the stored complementary bit data, the bit match signal has a predetermined logic. The maskable complementary circuit 24 includes a pair of inverters 38 and 40 and four MOS transistors 42, 44, 46 and 48, all of which have similar connections to those of the maskable true circuit 22.

Figure 3:
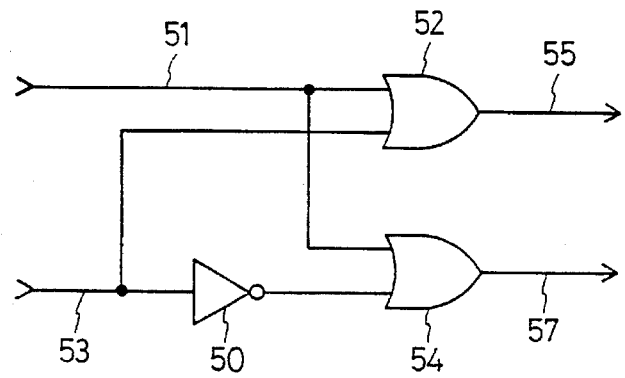
FIG. 3 is a circuit diagram of a bit data relay circuit for respectively relaying bit data and redundancy data to true and complementary data input lines shown in FIG. 2.

Referring to FIG. 3, there is illustrated a bit data relay circuit for relaying bit data and redundancy data from the bus line to the unit maskable memory cell of each of the first CAM 12 and the second CAM 14 shown in FIG. 1. The bit data relay circuit is included in each of the first CAM 12 and the second CAM 14.

The bit data relay circuit includes a pair of OR gates 52 and 54 for receiving a redundancy control signal from the first input line 51, and an inverter 50 for inverting bit data from a second input line 53. The inverter 50 serves to invert the bit data and then send the inverted bit data to the OR gate 54. The OR gate 52 operates logically the redundancy control signal from the first input line 51 and the bit data from the second input line 53, thereby generating true bit data. Where the redundancy control signal has a low logic, the bit data has the same logic value as the redundancy control signal. On the other hand, the true bit data always has a logic value of "1" when the redundancy control signal has a high logic. The OR gate 54 operates logically the redundancy control signal from the first input line 51 and the inverted bit data from the inverter 50, thereby generating complementary bit data. Where the redundancy control signal has the low logic, the complementary bit data has a logic value contrary to that of the true bit data. On the other hand, both the true bit data and the complementary bit data have the logic value of "1" when the redundancy control signal has the high logic. The true bit data and the complementary bit data are applied to the true bit data input line and the complementary bit data input line of the maskable memory cell via a first output line 55 and a second output line 57, respectively.

Figure 4:
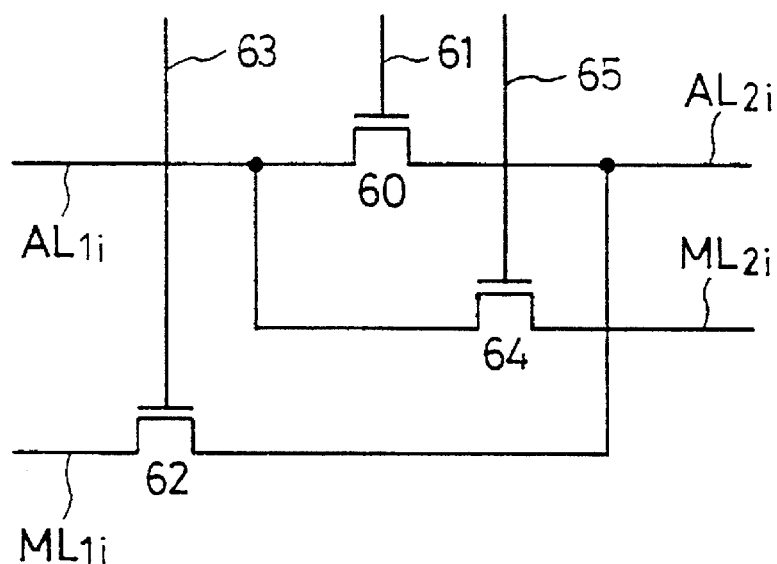
FIG 4 is a circuit diagram of a switch cell constituting a first switching stage shown in FIG. 1.

FIG. 4 shows a switch cell which constitutes the first switching stage 18 shown in FIG. 1. As shown in FIG. 4, the switch cell includes a MOS transistor 60 connected between the address enable line $AL_{1i}$ of the first CAM 12 and the address enable line $AL_{2i}$ of the second CAM 14, a MOS transistor 62 connected between the match line $ML_{1i}$ of the first CAM 12 and the address enable line $AL_{2i}$ of the second CAM 14, and a MOS transistor 64 connected between the address enable line $AL_{1i}$ of the first CAM 12 and the match line $ML_{2i}$ of the second CAM 14. When the MOS transistor 60 receives an updated mode signal of a predetermined logic from the first input 61 at its gate, it is turned on so that the address enable line $AL_{1i}$ of the first CAM 12 can be connected with the address enable line $AL_{2i}$ of the second CAM 14. When the MOS transistor 62 receives an encoding mode signal of a predetermined logic from the second input 62 at its gate, it is turned on so that the match line $ML_{1i}$ of the first CAM 12 can be connected with the address enable line $AL_{2i}$ of the second CAM 14. On the other hand, when the MOS transistor 64 receives a decoding mode signal of a predetermined logic from the third input 65 at its gate, it is turned on so that the address enable line $AL_{1i}$ of the first CAM 12 can be connected with the match line $ML_{2i}$ of the second CAM 14. The updated mode control signal, the encoding mode signal and the decoding mode signal may be generated from the central processing unit or key switches manipulated by an operator.

Figure 5:
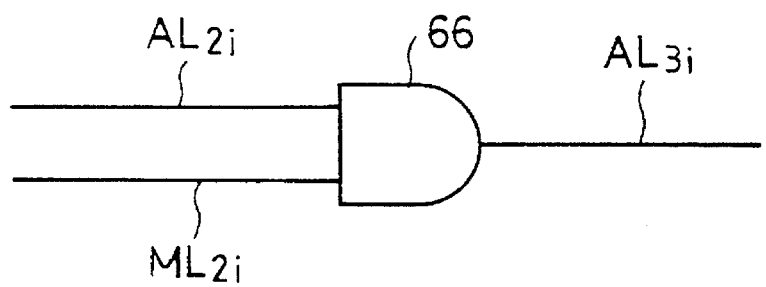
FIG. 5 is a circuit diagram of a switch cell constituting a second switching stage shown in FIG. 1.

Referring to FIG. 5, there is illustrated an AND gate which is used as the switch cell constituting the second switching stage 20 shown in FIG. 1. The AND gate 66 serves to AND-operate a logic signal from the address enable line $AL_{2i}$ of the second CAM 14 and a logic signal from the match line $ML_{2i}$ of the second CAM 14, and then send the resultant signal to the address enable line $AL_{3i}$ of the normal memory 16. When one of the logic signal from the address enable line $AL_{2i}$ of the second CAM 14 and a logic signal from the match line $ML_{2i}$ of the second CAM 14 has a low logic, the AND gate 66 applies a low logic signal to the address enable line $AL_{3i}$ of the normal memory 16, thereby causing the normal memory 16 to carry out a writing operation or a reading operation.

Figure 6:
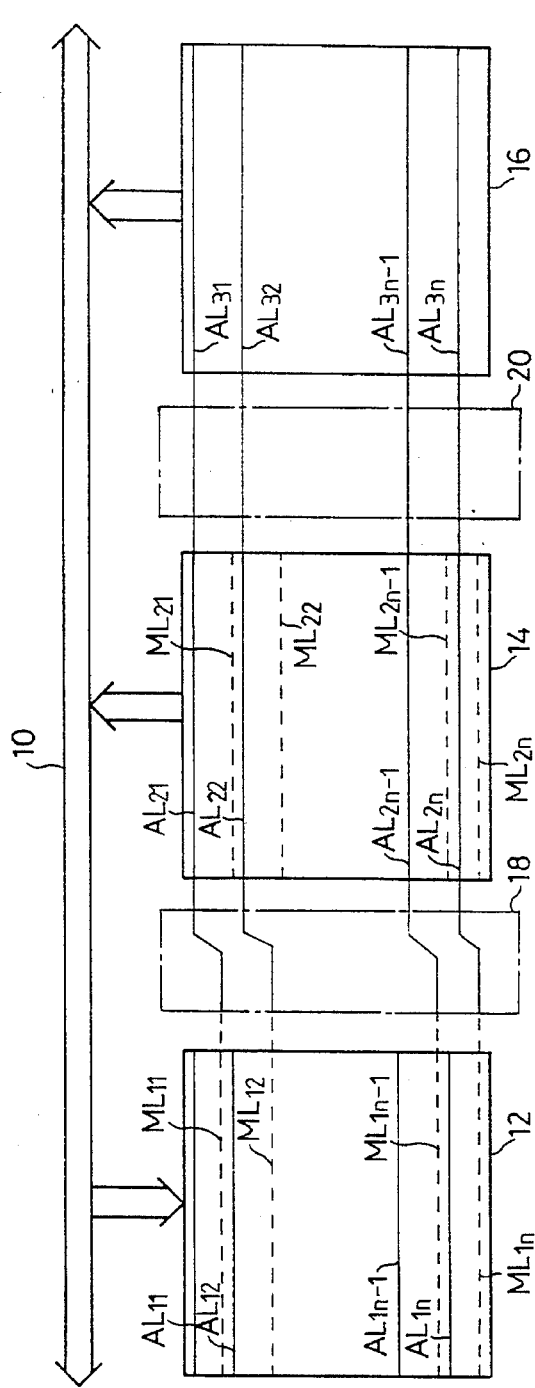
FIG. 6 is a diagram illustrating a connection condition of the adaptive variable-length coding apparatus shown in FIG. 1 in an encoding mode.

FIG. 6 explains a connection condition of the adaptive variable-length coding apparatus shown in FIG. 1 in the encoding mode. As shown in FIG. 6, the first switching stage 18 connects the match lines $ML_{11}$ to $ML_{1n}$ of the first CAM 12 to the address enable lines $AL_{21}$ to $AL_{2n}$ of the second CAM 14, respectively, whereas the second switching stage 20 connects the address enable lines $AL_{21}$ to $AL_{2n}$ of the second CAM 14 to the address enable line $AL_{31}$ to $AL_{3n}$ of the normal memory 16. The first CAM 12 compares the source symbol data from the bus line 10 with the source symbol data stored therein. On the other hand, the second CAM 14 and the normal memory 16 read variable-length code word and length data and then send the read variable-length code word and length data to the bus line 10, respectively.

Figure 7:
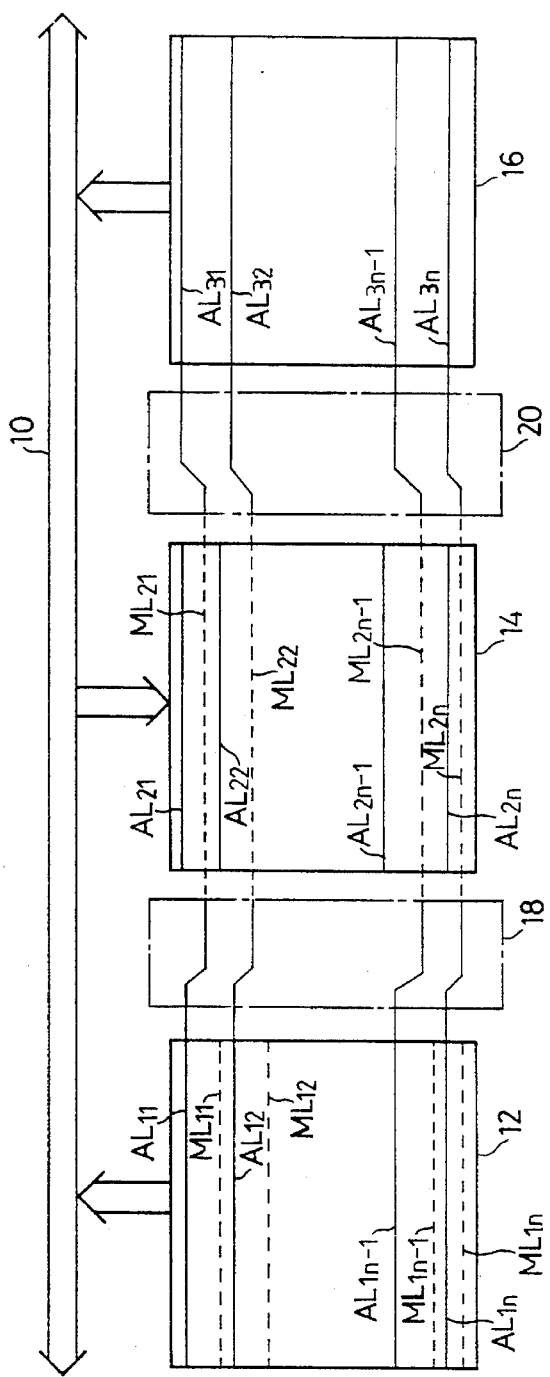
FIG. 7 is a diagram illustrating a connection condition of the adaptive variable-length coding apparatus shown in FIG. 1 in a decoding mode.

FIG. 7 explains a connection condition of the adaptive variable-length coding apparatus shown in FIG. 1 in the decoding mode. As shown in FIG. 7, the first switching stage 18 connects the address enable lines $AL_{11}$ to $AL_{1n}$ of the first CAM 12 to the match lines $ML_{21}$ to $ML_{2n}$ of the second CAM 14, respectively, whereas the second switching stage 20 connects the match lines $ML_{21}$ to $ML_{2n}$ of the second CAM 14 to the address enable line $AL_{31}$ to $AL_{3n}$ of the normal memory 16. The second CAM 14 compares the variable-length code word from the bus line 10 with the variable-length code words stored therein. On the other hand, the first CAM 12 and the normal memory 16 read source symbol data and length data corresponding to the variable-length code word, and then send the read source symbol data and length data to the bus line 10, respectively.

As apparent from the above description, the adaptive variable-length coding apparatus of the present invention has an advantage of easy conversion of variable-length code words and source symbol data by virtue of the provision of the accessible CAMs and memory. In addition, the adaptive variable-length coding apparatus can achieve encoding and decoding of variable-length code words selectively because it switches the address designation by the source symbol data and the address designation by the variable-length code words.

What is claimed is:

1. An adaptive variable-length coding apparatus comprising:

first content addressable memory means adapted to store source symbols each having a fixed length and generating an address signal corresponding to a source symbol to be variable-length coded;

second content addressable memory means adapted to store a number of variable-length code words and generating an address signal corresponding to a variable-length code word to be decoded into a corresponding source symbol;

normal memory means adapted to store a number of length data about lengths of variable-length code words stored in said second content addressable memory means;

first switching means connected between said first and second content addressable memory means and adapted to switch sending of said address signal generated in the first content addressable memory means to the second content addressable memory means and sending of said address signal generated in the second content addressable memory means to the first content addressable memory means; and second switching means adapted to selectively send the address signal generated in the first content addressable memory means and the address signal generated in the second content addressable memory means to said normal memory means.

2. An adaptive variable-length coding apparatus in accordance with claim 1, wherein said first switching means sends said address signal generated in said first content addressable memory means to said second content addressable memory means in a variable-length encoding mode and sends said address signal generated in said second content addressable memory means to said first content addressable memory means in a variable-length decoding mode.

3. An adaptive variable-length coding apparatus in accordance with claim 1, wherein said first switching means comprises MOS transistors.

4. An adaptive variable-length coding apparatus in accordance with claim 1, wherein said second switching means comprises a logically operating element.

* * * * *